United States Patent [19]

Rogers et al.

[11] 4,408,167

[45] Oct. 4, 1983

[54] CURRENT AMPLIFIER STAGE WITH DIODE INTERSTAGE CONNECTION

[75] Inventors: Dennis L. Rogers, Croton on Hudson; Albert X. Widmer, Katonah, both of N.Y.

[73] Assignee: International Business Machines Corporation, Armonk, N.Y.

[21] Appl. No.: 250,775

[22] Filed: Apr. 3, 1981

[51] Int. Cl.³ ............................................. H03F 3/45
[52] U.S. Cl. .................................... 330/261; 330/310
[58] Field of Search ................ 330/252, 261, 310, 311

[56] References Cited

U.S. PATENT DOCUMENTS 3,689,752  9/1972  Gilbert ............................. 330/252 X

OTHER PUBLICATIONS

Nagaikin, "Wideband Amplifiers With Diode Interstage Coupling", *Instruments and Experimental Techniques*, vol. 20, No. 3, 1977, New York, pp. 754–756.

*Primary Examiner*—James B. Mullins
*Attorney, Agent, or Firm*—Richard E. Cummins

[57] ABSTRACT

A multi-stage current mode differential amplifier is disclosed in which each cascaded stage includes a pair of input transistors which have their bases connected to a common voltage source and a pair of control transistors which have their emitters connected to a common current source. A diode-like device is inserted between the collector of a control transistor in one stage and the emitter of an input transistor of the succeeding stage which increases the input impedance seen by the control transistor, thereby permitting an increase in amplification for that stage. In both embodiments, the current signal is amplified at a higher rate than the rate of increase of the bias currents supplied to the emitters of the control transistors in each stage. In one embodiment, the arrangement of the diode in the collector circuit of the control transistor permits the voltage sources connected to the bases of the input transistors to remain substantially constant for each cascaded stage in contrast to prior art devices where the voltages had to be increased for each additional stage.

4 Claims, 5 Drawing Figures

CURRENT AMPLIFIER STAGE WITH DIODE INTERSTAGE CONNECTION

DESCRIPTION

1. Technical Field

This invention relates in general to current amplifier circuits and, in particular, to an improved multi-stage current amplifier in which signal currents increase from stage to stage at a rate faster than bias currents increase.

2. Background of the Invention

Various current mode amplifying techniques are known in the art. A representative differential multi-stage current mode amplifier is shown in U.S. Pat. No. 4,075,574, particularly FIGS. 5 and 7. Such amplifiers operate at a relatively high bandwidth but are limited in the amount of amplification because of problems encountered when cascading a number of stages.

As is taught in the referenced patent, the current gain in each stage is related to the bias current in succeeding stages. Bias current from one stage to the next, therefore, increases exactly proportional to the amplified signal. The increase in bias current has, therefore, limited the number of stages that can be employed and the overall gain of the amplifier. The present invention avoids this limitation of prior art current mode differential amplifying arrangements.

SUMMARY OF THE INVENTION

In accordance with the present invention, a multi-stage differential current mode amplifier is disclosed in which signal currents increase at a rate faster than the bias currents and, therefore, provides a greater amplification of the input signal without any decrease in the bandwidth relative to prior art amplifiers. The disclosed amplifier stage also does not require a larger bias voltage per amplifier stage relative to prior art amplifiers.

The improved amplifier employs at least one pair of diodes in each amplifying stage such that the signal currents in the inner pair of transistors, referred to in the referenced patent as the control device transistors, see a larger effective load resistance due to the diodes and, therefore, the stage has a larger current gain for a given ratio of bias currents. The improved amplifier has been found advantageous in amplifying small signals such as are encountered in magnetic head amplifiers for disk files and receivers that are used in fiber optic links carrying digital data.

It is, therefore, an object of the present invention to provide an improved current mode differential amplifier.

A further object of the present invention is to provide a high gain cascaded differential amplifier that can operate at relatively low bias currents and relatively low supply voltages.

The foregoing and other objects, features and advantages of the invention will be apparent from the following more particular description of a preferred embodiment of the invention as illustrated in the accompanying drawings.

DESCRIPTION OF THE INVENTION

Figure 1:
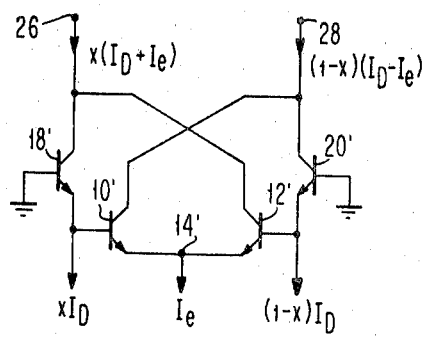
FIG. 1 illustrates one stage of a prior art current amplifier (FIG. 5 of U.S. Pat. No. 4,075,574)

The amplifier stage shown in FIG. 1 corresponds to the amplifier stage shown in FIG. 5 of U.S. Pat. No. 4,075,574, referred to earlier in the specification. Transistor 18' and transistor 20' are referred to as the input transistors. Complementary input currents $xI_D$ and $(1-x)I_D$ are added to the amplifier output currents. The term "x" used in the referenced patent is the actual variable input to the stage, that is, it varies between 0 and 1, and may be thought of as a modulation index for the current $I_D$. The term "$I_e$" is the current supplied to the common emitter connection of devices 10' and 12'. The collector 18C of transistor 18' is connected to the collector 12C of inner transistor 12'. Collector 20C of transistor 20' is similarly connected to collector 10C of inner transistor 10'. The output current at terminal 26 is, therefore, $x(I_D+I_e)$, while the output current at terminal 28 becomes $(1-x)(I_D+I_e)$. The input currents are effectively combined with the output currents in an added phase sense. The gain of the stage is given as the ratio of $(I_e+I_D)I_D$.

Figure 2:
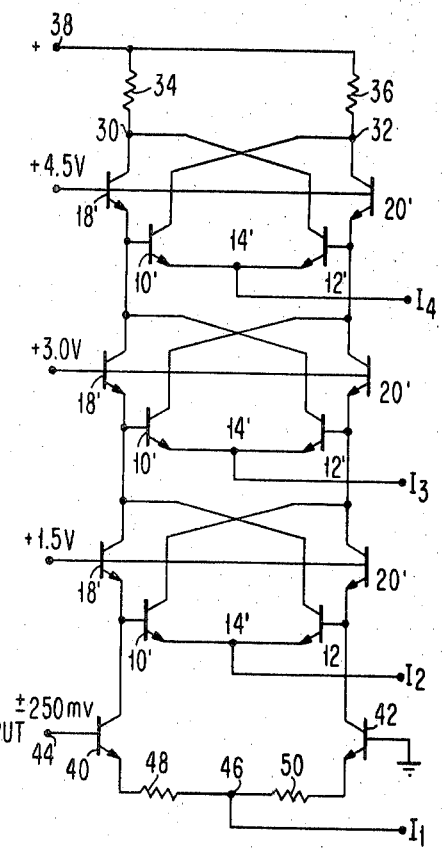
FIG. 2 illustrates a prior art multi-stage current mode amplifier (FIG. 7 of U.S. Pat. No. 4,075,574)

FIG. 2 corresponds to FIG. 7 of the referenced patent and illustrates a three-stage current mode amplifier where each stage is similar to FIG. 5. As explained in the description of FIG. 7, the gain of the circuit is controlled by controlling the ratio of supply currents $I_4$, $I_3$, and $I_2$ with respect to $I_1$.

Figure 3:
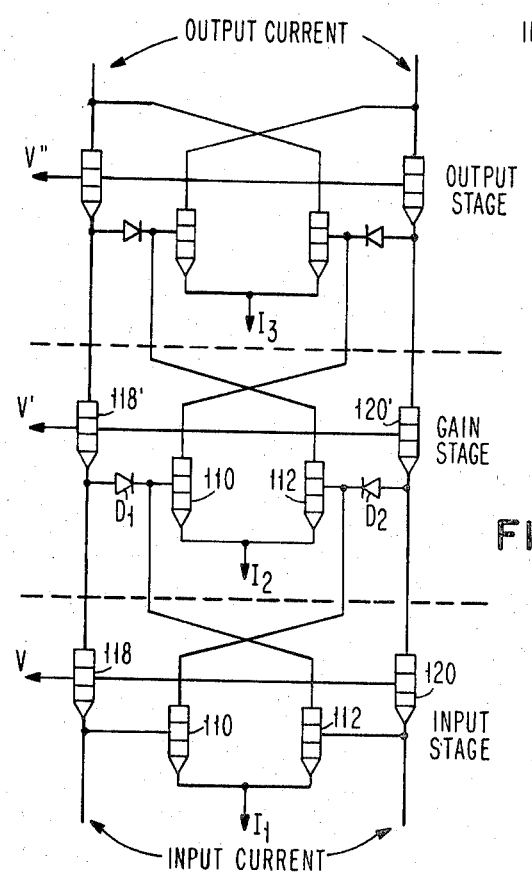
FIGS. 3 and 3a illustrate improved multi-stage current mode amplifiers embodying the present invention.

FIG. 3 illustrates a series of gain stages in which the signal currents increase from stage to stage at a rate faster than that of the bias currents $I_1$, $I_2$, and $I_3$. This is because, in accordance with the present invention, the signals in transistors 110 and 112 see a larger effective load resistance due to the addition of diodes $D_1$ and $D_2$. Diode $D_1$, as shown in FIG. 3, is connected between the collector of transistor 112 and the emitter of transistor 118' of the succeeding stage, while diode $D_2$ is similarly arranged relative to transistors 110 and 120' of the succeeding stage. The added diodes can be any devices with diode-like characteristics, such as diode connected transistors or emitter follower circuits.

It is possible to increase the gain of the amplifier further, assuming that the ratio of the bias currents remain the same, by adding additional diodes in series between the emitters of 118', 120', and the bases of 110', 112', respectively.

Figure 3A:
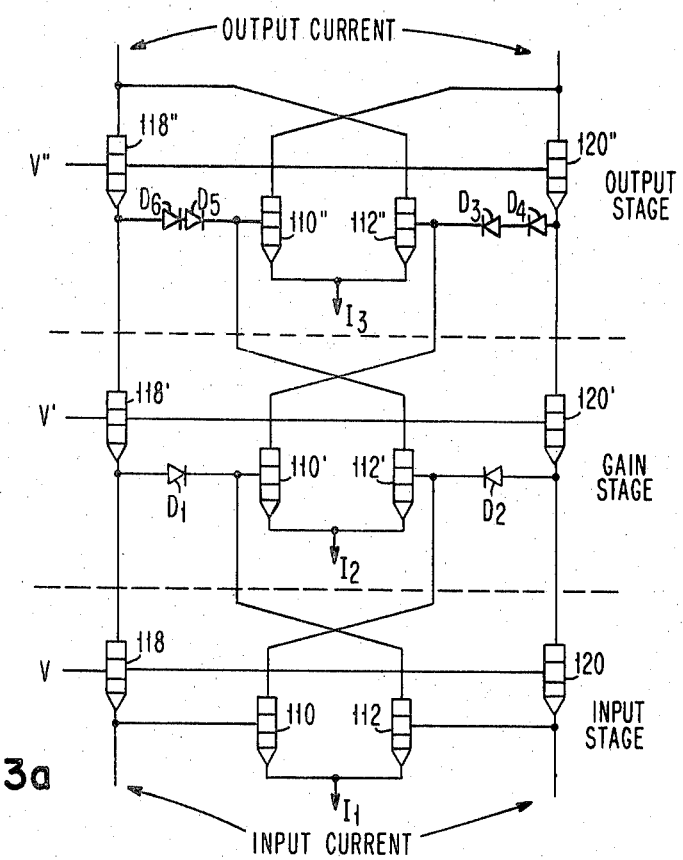

In practice, as shown in FIG. 3a, one would load the first stage 110, 112 with one diode $D_1$, $D_2$ in each collector circuit; the second stage 110', 112' with two diodes $D_3$, $D_4$ and $D_5$, $D_6$ in each collector circuit; the third with three diodes, etc., keeping in mind that the emitter impedance decreases with increasing current and that by this procedure, one would avoid the reverse biasing of the collectors of the control transistors 110 and 112 of each stage while at the same time maximizing the gain.

Calculations indicate that a five-stage amplifier embodying the present invention would have a gain of approximately 250 without impairing the bandwidth relative to prior art amplifiers, where the only limitation in bandwidth is that of the component transistors.

Figure 4:
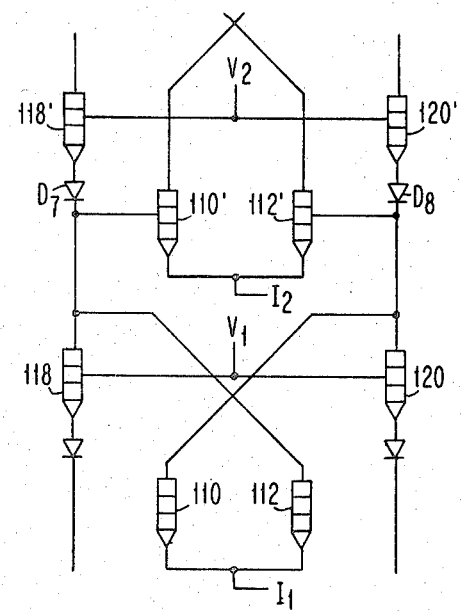
FIG. 4 illustrates a modification of one stage of the amplifier shown in FIG. 3.

FIG. 4 shows a modification of the arrangement shown in FIG. 3. As shown in FIG. 4, the diode $D_7$ is placed in the circuit so that it is in series with the collector of transistor 112, while the collector of transistor 118 is connected to the emitter of transistor 118', also through diode $D_7$. Diode $D_8$ is similarly connected between the collector of transistor 110 and the emitter of 120', while the collector of transistor 120 is connected to the emitter of transistor 120' through diode $D_8$.

Since, as will be recognized by those skilled in the art, the bias voltage for succeeding stages shown in FIG. 4 will need to be increased, the FIG. 4 embodiment is more limited in application than the circuits of FIGS. 3 and 3a, where bias voltages are not as readily affected.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new and desire to secure by Letters Patent is:

1. A multi-stage current mode differential amplifier having an input stage and a plurality of cascaded stages, characterized by each cascaded stage, comprising:
   a pair of input transistors;
   a pair of control transistors;
   four input lines;
   four output lines adapted to be connected to the input lines of the succeeding stage; and
   first and second diode devices;
   said four output lines extending respectively from the collectors of said four transistors;
   two of said input lines being connected respectively to the emitters of said input transistors;
   the other two of said input lines being connected respectively to the bases of said control transistors;
   the emitter of each said control transistor being connected to a common current source and the base of each said input transistor being connected to a common bias voltage source;
   each said diode device being connected between the base of one of said control transistors and the emitter of one of said input transistors, whereby the load impedance at each said control transistor in one stage is effectively increased by the diode device in the succeeding stage without requiring a corresponding increase in bias voltage for said succeeding stage relative to the bias voltage for said preceding stage.

2. The amplifier recited in claim 1 further characterized by said diode device being a simple diode.

3. The amplifier recited in claim 1 in which the diode device in the first cascaded stage comprises a simple diode, and the diode device in each succeeding cascaded stage comprises a plurality of serial connected simple diodes.

4. The amplifier recited in claim 3 in which the number of serial connected diodes for each said succeeding stage is increased by 1 for each stage relative to the preceding stage.

* * * * *